(12) United States Patent
Cima

(10) Patent No.: US 11,360,162 B2
(45) Date of Patent: Jun. 14, 2022

(54) CURRENT SENSOR WITH MAGNETIC FIELD CIRCULATION

(71) Applicant: NEELOGY, Saint Avertin (FR)

(72) Inventor: Lionel Cima, Saint-Cyr-sur-Loire (FR)

(73) Assignee: NEELOGY, Saint Avertin (FR)

( * ) Notice: Subject to any disclaimer, the term of this patent is extended or adjusted under 35 U.S.C. 154(b) by 206 days.

(21) Appl. No.: 16/625,540

(22) PCT Filed: Jun. 14, 2018

(86) PCT No.: PCT/EP2018/065750
§ 371 (c)(1),
(2) Date: Dec. 20, 2019

(87) PCT Pub. No.: WO2018/234133
PCT Pub. Date: Dec. 27, 2018

(65) Prior Publication Data
US 2021/0356534 A1    Nov. 18, 2021

(30) Foreign Application Priority Data

Jun. 23, 2017 (FR) ...................................... 1755775

(51) Int. Cl.
*G01R 33/04* (2006.01)
*G01R 15/18* (2006.01)

(52) U.S. Cl.
CPC .......... *G01R 33/04* (2013.01); *G01R 15/181* (2013.01)

(58) Field of Classification Search
CPC ...... G01R 33/06; G01R 33/063; G01R 33/12; G01R 33/18; G01R 33/04; G01R 33/045; G01R 15/18–188
See application file for complete search history.

(56) References Cited

U.S. PATENT DOCUMENTS 9,535,098 B2 * 1/2017 Popovic ............... G01R 15/207
9,606,146 B2 * 3/2017 Bannister ............ G01R 15/181
(Continued)

FOREIGN PATENT DOCUMENTS

EP    2009453 A1    12/2008
EP    2084720 B1    8/2014
(Continued)

OTHER PUBLICATIONS

IEEE, "IEEE Guide for the Application of Rogowski Coils Used for Protective Relaying Purposes", IEEE Std C37.235(tm)—2007, IEEE Power Engineering Society, Feb. 22, 2008, 55 pages.
(Continued)

*Primary Examiner* — Huy Q Phan
*Assistant Examiner* — David B Frederiksen
(74) *Attorney, Agent, or Firm* — Womble Bond Dickinson (US) LLP

(57) ABSTRACT

The present invention relates to a device for measuring a magnetic field and, more specifically, for measuring direct and/or alternating currents circulating in a primary conductor. The current sensor 1 according to the invention comprises: •at least two magnetic transducers 2, 3, each comprising at least one elongate coil 5, 6, forming a loop surrounding the primary conductor; •at least one loop closure mechanism allowing two ends of the coils 5, 6 of a transducer 2, 3 to be retained while providing: —a negative mechanical gap between the two ends of the coils 5, 6 closing each loop, along a first elongation axis Y of the coils 5, 6; an offset of each end of a coil 5, 6 of a loop relative to the other end of a coil of the loop, along an offset axis X; —a mechanical inversion of the offsets between the loops.

15 Claims, 2 Drawing Sheets

(56) References Cited

U.S. PATENT DOCUMENTS

| | | | |
|---|---|---|---|
| 9,989,562 B2* | 6/2018 | Grňo | H01F 38/40 |
| 2008/0106254 A1* | 5/2008 | Kojovic | G01R 15/181 |
| | | | 336/200 |
| 2009/0243590 A1* | 10/2009 | West | G01R 19/04 |
| | | | 324/117 R |
| 2011/0140694 A1 | 6/2011 | Cima et al. | |
| 2011/0227560 A1* | 9/2011 | Haratani | B82Y 25/00 |
| | | | 324/117 R |
| 2016/0370125 A1* | 12/2016 | Gilbert | F28D 20/0034 |

FOREIGN PATENT DOCUMENTS

| | | | | |
|---|---|---|---|---|
| EP | 2887076 A1 | | 6/2015 | |
| FR | 2891917 A1 | | 4/2007 | |
| FR | 2931945 A1 | | 12/2009 | |
| FR | 2971852 A1 | * | 8/2012 | ......... G01R 33/0213 |
| FR | 2971852 A1 | | 8/2012 | |
| JP | 11-295348 A | | 10/1999 | |
| JP | 2002-333455 A | | 11/2002 | |

OTHER PUBLICATIONS

International Preliminary Report on Patentability received for PCT Patent Application No. PCT/EP2018/065750, dated Jan. 2, 2020, 20 pages (11 pages of English Translation and 9 pages of Original Document).

International Search Report and Written Opinion received for PCT Patent Application No. PCT/EP2018/065750, dated Oct. 8, 2018, 24 pages (12 pages of English Translation and 12 pages of Original Document).

Preliminary Research Report received for French Application No. 1755775, dated Feb. 26, 2018, 4 pages (1 page of French Translation Cover Sheet and 3 pages of original document).

Vourc'h et al., "Analytical and Numerical Analyses of a Current Sensor Using Non Linear Effects in a Flexible Magnetic Transducer", Progress In Electromagnetics Research, vol. 99, Dec. 31, 2009, pp. 323-338.

Vourc'h et al., "Neel Effect Toroidal Current Sensor", IEEE Transactions on Magnetics, Institute of Electrical and Electronics Engineers, vol. 49, No. 1, 2013, pp. 81-84.

* cited by examiner

CURRENT SENSOR WITH MAGNETIC FIELD CIRCULATION

The present invention relates to a device for measuring a magnetic field and more particularly for measuring direct and/or alternating currents flowing in a primary conductor. The field of the invention is that of measuring magnetic fields, as in magnetometers or measuring electric currents via their magnetic fields, as in contactless current transducers.

Current sensors such as current sensors of the Rogowski type are known which determine the value of a current passing through a primary conductor based on the circulation of a magnetic field generated by said current. Sensors of the Rogowski type use transducers also called Rogowski probes. Such transducers generally comprise an elongate coil extending around an elongate flexible core constituted by a non-magnetic material. The Rogowski transducer is then combined with an electronic circuit which determines, based on electrical magnitudes measured at the terminals of the coil, the value of the magnetic flux circulating inside said coil in order to deduce therefrom, when the coil surrounds an electrical conductor, the intensity of current flowing in the electrical conductor. Rogowski transducers are particularly effective for producing measurements of alternating currents beyond a certain cut-off frequency. However, they have the disadvantage of being ineffective for measuring direct currents.

For measuring direct currents, there is a technology called Neel Effect® technology. Neel Effect® denotes the technology described in patent application FR2891917. Neel Effect® technology is based on using a transducer formed from a winding surrounding a magnetic composite without remanence B(H), the third derivative of which has an extremum at the origin. The magnetic component is for example a superparamagnetic composite. Neel Effect® technology is not very sensitive to external fields due to the low permeability of the magnetic material used. Neel Effect® transducers exist in a flexible "universal" form that is particularly suitable for measuring direct currents for example as described in patent application FR2931945. The topology presented in patent application FR2931945 has a high immunity to crosstalk by an implementation in practice of the Ampere theorem, i.e. measuring the circulation of the magnetic field on a substantially closed outer contour.

It is also possible to combine a Neel Effect® sensor and a conventional sensor of the Rogowski type in order to produce an "all-pass" sensor having a wide passband including direct current.

Generally, the method for manufacturing flexible coiled sensors is based on the production of a transducer cable of great length. The cable is then cut to the correct length to form a transducer with two ends. In order to form a loop, which can optionally be "opening", the two ends are connected by a closure mechanism.

One of the defects of measuring current based on the circulation of the magnetic field using coiled sensors is due to the presence of a gap between the two ends of the winding at the level of the closure mechanism. This gap introduces in particular three types of error into the measurement of the current:

a gain error at the level of the measurement of the current in the primary conductor, which depends on the position of the primary conductor with respect to the closure mechanism;
an error due to the sensitivity of the sensor to external magnetic fields;
an error due to the sensitivity of the sensor to the currents of the surrounding conductors.

Each time, this error is due to the fact that the circulation of the magnetic field in the coil does not take place on a closed circuit.

In other words, this error is proportional to the circulation of the magnetic field which is not measured in the gap.

There are different known techniques for reducing this error associated with the gap.

For example, it is conventional to use an additional secondary winding which is placed at the level of the gap and the function of which is to complete the measurement of the circulation of the field with an estimation of the circulation in the gap. This technique is in particular described in patent application EP2887076. However, this simple solution has some drawbacks:

it requires an additional industrial operation in the production thereof, or an additional component;
it does not completely correct the gain or crosstalk errors when the conductors are very close to the gap;
it does not function with direct current.

Another conventional solution is the use of a magnetic core placed in the gap and making it possible to reduce the reluctance of this gap. Thus, from a magnetic point of view, the gap is reduced considerably by the permeability effect of the magnetic core. Such a solution is described for example in patent application EP2009453 and has the following drawbacks:

it requires an additional industrial operation in the production thereof, or an additional component;
it does not completely correct the gain or crosstalk errors when the primary conductors are very close to the gap;
it adds non-linearity errors due to the ferromagnetic core.

The need has therefore arisen for a new type of closure mechanism which is both more effective and can be adapted for measuring alternating currents and direct currents.

At least one of the abovementioned objectives is achieved with a sensor for a current flowing in a primary conductor. Said sensor carries out a circulation measurement of a magnetic field generated by the current flowing in said primary conductor. The sensor is characterized in that it comprises:

at least two magnetic transducers, each magnetic transducer comprising at least one elongate coil extending around a flexible support, said magnetic transducer forming a loop surrounding the primary conductor;
at least one mechanism for closing the loops of the magnetic transducers making it possible to hold two ends of the elongate coils of a magnetic transducer, while ensuring:
a mechanical gap less than or equal to zero between the two ends of elongate coils closing each loop, along a first elongation axis of the coils, said elongation axis being substantially tangent to said ends;
an offset of each coil end of a loop with respect to the other coil end of the loop, along an offset axis different from the first elongation axis;
a mechanical inversion of the offsets between the loops.

The sensor advantageously comprises an even number of loops.

The mechanical gap between the two ends closing a loop is for example less than five times the average diameter of the turns of the coil.

The offset axis can be substantially perpendicular to the first elongation axis Y.

The mechanical gap between the two ends closing a loop, along the offset axis X, is substantially equal to the mechanical gaps of at least two other ends closing another loop of the sensor.

The closure mechanism can be an opening mechanism comprising for example a reversible fastening system.

In a particular embodiment, each transducer can comprise two coils forming an open loop.

As each loop then comprises four coil ends, two coil ends of one and the same loop can be assembled by the closure mechanism and the other two ends of the coils can be assembled to form a connection with an electronic device of the sensor.

In a possible embodiment, the sensor according to the invention can comprise at least one transducer suitable for measuring a direct current.

In the same embodiment, or in another possible embodiment, the sensor can comprise at least one transducer suitable for measuring an alternating current.

One of said transducers can be, for example, a Neel Effect® transducer. The elongate support can then be a substantially solid magnetic core, constituted by a flexible magnetic material comprising a matrix in which magnetic particles are dispersed.

The closure mechanism can comprise a device for adjusting the mechanical gap.

One of said transducers can be a Rogoswski coil.

In a variant of the invention, the sensor can comprise at least two coils suitable for measuring a direct current and at least two coils suitable for measuring an alternating current.

The sensor can also comprise at least four coils suitable for measuring a direct current.

The sensor according to the invention is advantageously simple to produce. It is also suitable for providing an accurate current measurement. Another advantage of the sensor according to the invention is that it can be easily adapted to carry out a measurement of direct current, a measurement of alternating current or even one or the other of these measurements using one and the same sensor.

Other advantages and characteristics of the invention will become apparent on examination of the detailed description of several embodiments which are in no way limitative, and the attached drawings, in which.

The embodiments that will be described hereinafter are in no way limitative; in particular, variants of the invention can be implemented comprising only a selection of the characteristics described hereinafter, in isolation from the other characteristics described, if this selection of characteristics is sufficient to confer a technical advantage or to differentiate the invention with respect to the state of the prior art. This selection comprises at least one, preferably functional, characteristic without structural details, or with only a part of the structural details if this part alone is sufficient to confer a technical advantage or to differentiate the invention with respect to the state of the prior art.

In particular, all the variants and all the embodiments described are intended to be combined together in any combinations, if there is no objection to this from a technical point of view.

Figure 1:
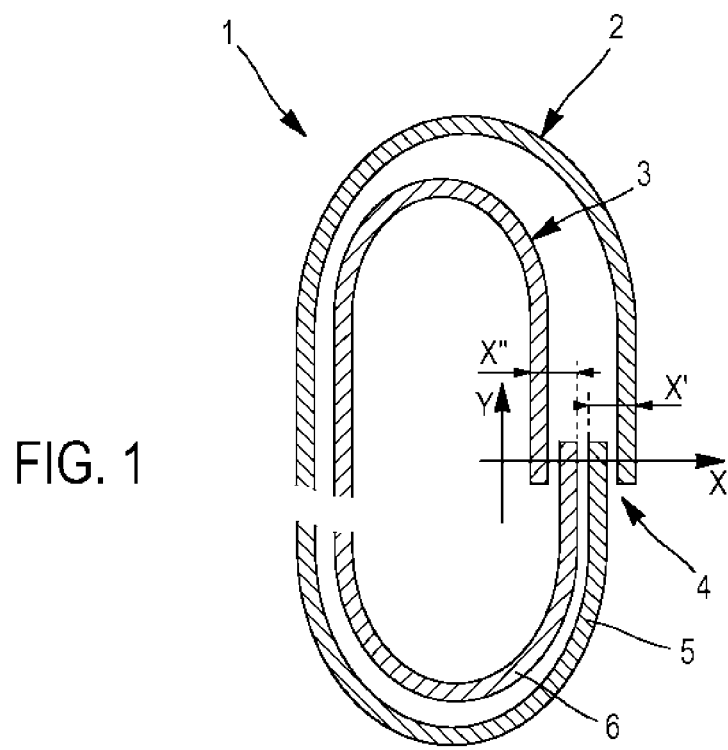
FIG. 1 is a diagrammatic view of a current sensor according to the invention showing most particularly the gap between the coil ends.

FIG. 1 presents a current sensor 1 according to the invention. The current sensor measures a current flowing in a primary conductor (not shown), surrounded by the current sensor 1. The principle used by the current sensor 1 is based on measuring a magnetic field generated by the current flowing in the primary conductor.

The current sensor 1 according to the invention is composed of at least two magnetic transducers 2, 3. Each magnetic transducer 2, 3 can be composed of one or more coils 5, 6 for example made from copper. The coils 5, 6 are elongate and wound around a flexible support. In FIG. 1, the sensor 1 comprises two transducers 2, 3 and each transducer 2, 3 comprises a single coil 5, 6. Each transducer is connected in a conventional manner to an electronic circuit (not shown) responsible for carrying out the measurement.

The transducers 2, 3 can be assembled concentrically around the primary conductor. The transducers can for example be situated substantially in one and the same transverse plane with respect to the primary conductor. In FIG. 1 and in the remainder of the disclosure, the number of transducers is an even number.

Each transducer forms an open loop around the primary conductor. The coils 5, 6 composing each transducer forming the open loop, form at least one opening 4 in the transducer, said opening 4 being coincident for all of the transducers. According to the invention, two ends of the coils 5, 6 of one and the same transducer overlap at the level of the opening 4, so as to close the loop. The overlap of the ends of the coils 5, 6 of one and the same transducer 2, 3 forms an offset of these ends with respect to one another.

The distance between the two ends of the coils 5, 6 of one and the same transducer 2, 3 is expressed as a mechanical gap that is negative or zero or also less than or equal to zero, along an elongation axis Y of the coils. For example the mechanical gap can be defined with respect to a first axis Y that is substantially tangent to the ends of the coils 5, 6. The fact of using a mechanical gap that is negative or zero in the direction of the elongation axis Y of the coils 5, 6 makes it possible to estimate with a high degree of accuracy the circulation of the magnetic field on a path, formed by the coils 5, 6, and closed in the direction of the elongation axis Y of the coils 5, 6. The fact of having a negative mechanical gap thus makes it possible to compensate for the effects associated with the edges of the coils 5, 6. The length of the mechanical gap can be less than five times the average diameter of a turn of the winding of a coil, or less than twice the diameter of a turn of a winding, or once, or half, or a quarter or zero. Generally, the length of the mechanical gap depends in particular on the diameter of the winding, the number of layers of turns in the winding, etc.

The offset between the two ends of one and the same loop can be measured along a second offset axis X that is different from the first axis Y. For example, the second offset axis X can be substantially perpendicular to the first elongation axis Y. The gap between the two ends of coils 5, 6 of one and the same transducer 2, 3 along the offset axis X is called offset gap. Thus, the offset of the first transducer 2 is a negative offset X" in the direction of the axis X and the offset of the second transducer 3 is a positive offset X' in the direction of the axis X. The offset gap X', X" between two ends of one and the same loop, or of one and the same transducer 2, 3, must be substantially equal to the offset gap between two ends of another loop, or transducer 2, 3 of the sensor 1 according to the invention.

The offset gaps of each transducer are produced in opposite directions along the offset axis X in order to cancel out the measurement errors associated with the presence of the discontinuity of the coils 5, 6, by the difference between the two electromagnetic field magnitudes measured. In other words, the offset of the first transducer 2 is the symmetric opposite of the offset of the second transducer 3 with respect to a plane of symmetry passing through the first elongation axis Y and substantially perpendicular to the plane of the transducers. Thus as shown in FIG. 1, two ends, including one from each coil 5, 6 of the two transducers 2, 3 are positioned on either side of the two other ends of each coil 5, 6 of the two transducers 2, 3. It is then said that there is a mechanical inversion of the offsets between the two transducers 2, 3. Advantageously, the mechanical inversion of the offsets between the two transducers 2, 3 makes it possible to carry out a differential measurement in order to eliminate the impacts of the orthogonal magnetic fields generated by the primary conductor at the level of the ends of the coils 5, 6. In fact, the measurement error introduced by the offset of the ends of the coils 5, 6 is proportional to the magnetic fields orthogonal to the first elongation axis Y of the windings and to the magnitude X'-X". Thus, if X'=X", all of the errors can be eliminated.

Figure 2:
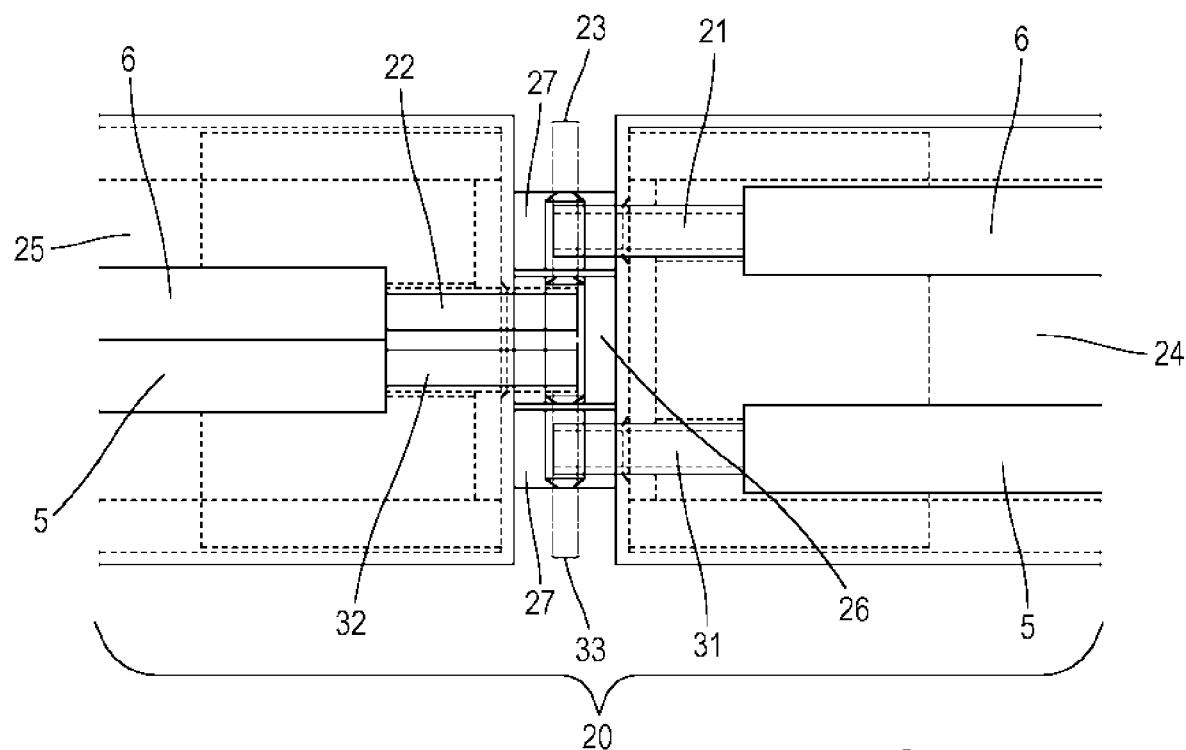
FIG. 2 is a top view of a closure mechanism of the sensor according to the invention.
Figure 3:
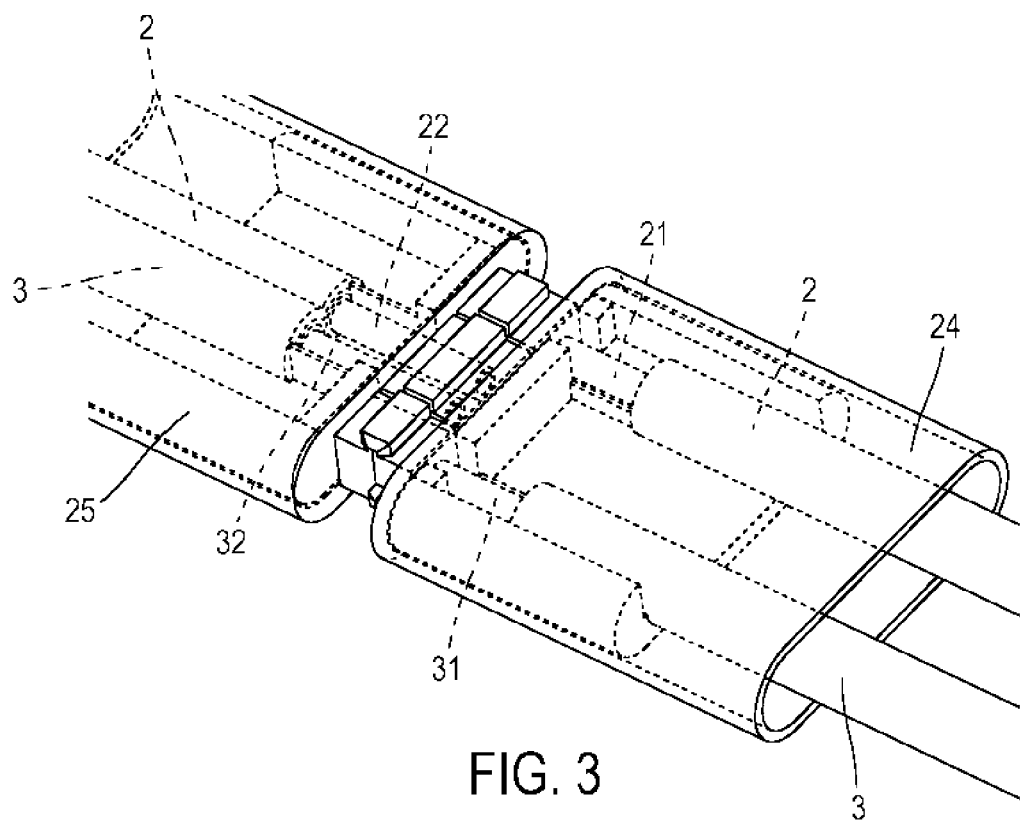
FIG. 3 is a perspective view of the closure mechanism of the sensor according to the invention.

FIG. 2 is a top view of a closure mechanism 20 of the loops of the transducers 2, 3 according to the invention. FIG. 3 shows the same closure mechanism 20 in a perspective view. FIGS. 2 and 3 repeat the references in FIG. 1 for objects described previously. In FIGS. 2 and 3 it is possible in particular to see the two ends 21, 22, 31, 32 of the coils 5, 6 of each transducer 2, 3. Thus the first end 21 of the first coil 6 is located externally in the closure mechanism 20, while the second end 22 of the first coil 6 is located internally in the closure mechanism 20. The first end 32 of the second coil 5 is located close to the second end 22 of the first coil 6 internally, in the closure mechanism 20. And the second end 31 of the second coil 5 is located externally in the closure mechanism 20. By "internally in the closure mechanism" is meant a position close to a centre of the closure mechanism 20. By "externally in the closure mechanism" is meant being close to the outer casing of the closure mechanism 20 while still being inside the closure mechanism 20.

The closure mechanism 20 comprises two parts 24, 25 each surrounding a coil end 5, 6 of one of the transducers 2, 3. The closure mechanism can be produced by means of a box made from plastic or from resin bonded around the ends of the coils 5, 6 or even overmoulded around said ends of the coils 5, 6.

The two portions 24, 25 are arranged in order to be plugged one into the other in order to produce the closing of the loops of the transducers 2, 3 while ensuring:
  a negative longitudinal mechanical gap 23, 33 between the two coil ends closing each transducer loop 2, 3 and,
  a lateral offset of each end with respect to the other end of the coil 5, 6, closing one and the same transducer 2, 3.

Advantageously, the closure mechanism 2 can be said to be reversible in the sense that it allows several closings and openings of the loops of the transducers 2, 3 for example in order to allow said sensor to be positioned around the primary conductor, then to remove said sensor. To this end, the closure mechanism 20 can comprise a reversible fastening system comprising two parts 26, 27 each firmly fixed to one of the parts of the closure mechanism 24, 25, said parts 26, 27 of the reversible fastening system being suitable for being fastened or not fastened to one another. For example, the reversible fastening system can comprise hooks and loops, screws and threaded holes, clips etc.

The sensor 1 as shown in FIGS. 1, 2, 3 can be a sensor 1 using transducers 2, 3 suitable for measuring a direct current or an alternating current or both. Thus, the sensor 1 can comprise, exclusively or not, Neel Effect® transducers particularly suitable for measuring a direct current. The sensor 1 can also comprise, exclusively or not, Rogowski coil transducers particularly suitable for measuring alternating currents.

A Neel Effect® transducer comprises an elongate support produced in the form of an elongate flexible magnetic core that is substantially solid. The magnetic core is constituted by a flexible magnetic material comprising a flexible or resilient matrix in which magnetic particles are dispersed.

Figure 4:
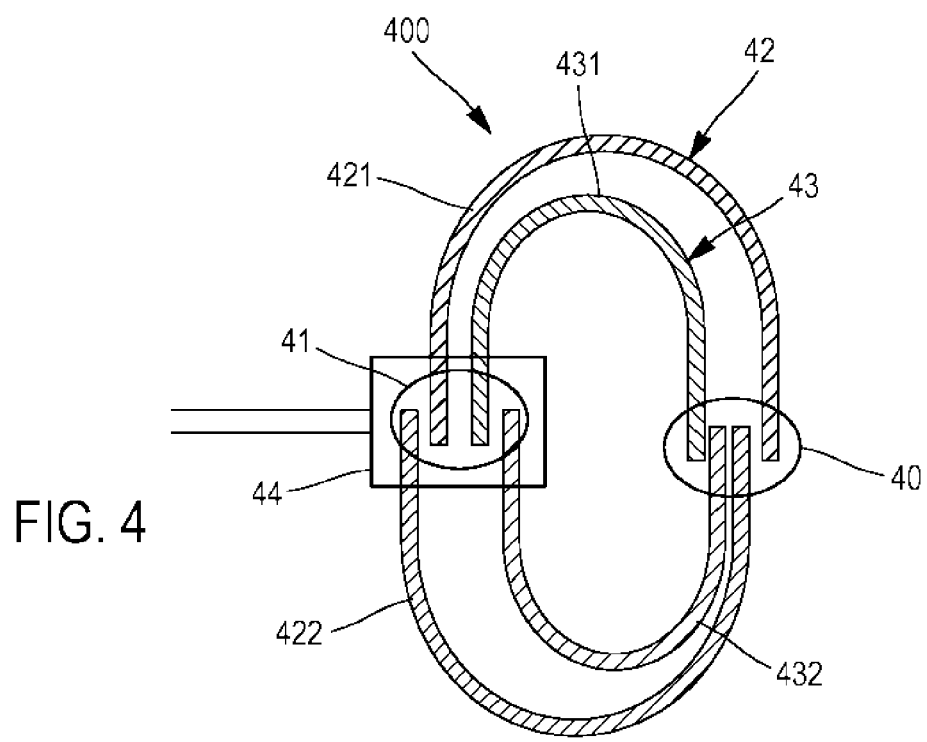
FIG. 4 is a diagrammatic representation of an example sensor according to the invention having four coils.

In a variant of the sensor according to the invention, shown in FIG. 4, a sensor 400 comprises two transducers 42, 43 each composed of two coils respectively 421, 422 and 431, 432, mounted in pairs to form a transducer loop 42, 43. The sensor 400 thus presents two openings 40, 41 that can each be the subject of a closure mechanism 20 as presented above. Advantageously, one of the openings 41 can be used for connecting the transducers to an electronics 44 of the sensor 400 suitable for transmitting and taking account of the measurements carried out by the transducers 42, 43 in order to calculate the current flowing in a primary conductor (not shown) surrounded by the sensor 400. The four coils 421, 431, 422, 432 can be arranged in order to carry out a measurement using the Neel Effect® or a Rogowski measurement.

In another variant derived from FIG. 1 and not shown, the coils can be used in the following manner: at least four coils can be used in order to produce a Neel Effect® transducer by combining therewith two other coils composing another transducer for a Rogowski measurement.

In yet another variant derived from FIG. 4 and not shown, four coils 421, 422, 431, 432 can be used in order to produce a Neel Effect® transducer and four other coils can be used to produce a transducer of the Rogowski type.

It is possible to add to the closure mechanism 20 a device for adjusting the mechanical gap. To this end, the closure mechanism 20 comprises a system for guiding ends of the coils in translation as well as a system for holding the ends of the coils, said holding device making it possible to control the mechanical gap thereof. Thus, it is possible to adjust the depth of an interleaving between the two loops along first elongation axis Y. The adjustment device can be based on the use of screws, shims or a slide.

Of course, the invention is not limited to the examples which have just been described, and numerous adjustments may be made to these examples without departing from the scope of the invention.

The invention claimed is:

1. Sensor for current flowing in a primary conductor, carrying out a measurement of the circulation of a magnetic field generated by the current flowing in said primary conductor, comprising:
  at least two magnetic transducers, each magnetic transducer comprising at least one elongate coil extending around a flexible support, each said magnetic transducer forming a loop surrounding the primary conductor;

at least one closure mechanism for the loops of the magnetic transducers to hold two ends of the elongate coil of each magnetic transducer, while ensuring:
- a mechanical gap less than or equal to zero between the two ends of the elongate coil closing each loop, along a first elongation axis Y of the coils, said elongation axis Y being substantially tangent to said ends;
- for each loop, an offset of one end of the elongate coil of the loop with respect to the other end of the elongate coil of the loop, along an offset axis X different from the first elongation axis Y;
- a mechanical inversion of the offsets between the loops.

2. The sensor according to claim 1, comprising an even number of loops.

3. The sensor according to claim 1, wherein the mechanical gap between the two ends closing the loop is less than five times the average diameter of the turns of the coil.

4. The sensor according to claim 1, wherein the offset axis X is substantially perpendicular to the first elongation axis Y.

5. The sensor according to claim 4, wherein the mechanical gap between two ends closing the loop, along the offset axis X, is substantially equal to the mechanical gaps of at least two other ends closing another loop of the sensor.

6. The sensor according to claim 1, wherein the closure mechanism is an opening mechanism comprising a reversible fastening system.

7. The sensor according to claim 1, wherein each transducer comprises two coils forming an open loop.

8. The sensor according to claim 7, wherein each loop comprising four coil ends, two coil ends of one and the same loop are assembled by the closure mechanism and the other two ends of the coils are assembled to form a connection with an electronic device (44) of the sensor.

9. The sensor according to claim 1, comprising at least one transducer suitable for measuring a direct current.

10. The sensor according to claim 1, comprising at least one transducer suitable for measuring an alternating current.

11. The sensor according to claim 1, wherein one of said transducers is a Neel Effect® transducer.

12. The sensor according to claim 11, wherein the elongate support is a substantially solid magnetic core, constituted by a flexible magnetic material comprising a matrix in which magnetic particles are dispersed.

13. The sensor according to claim 1, wherein the closure mechanism comprises a device for adjusting the mechanical gap.

14. The sensor according to claim 10, comprising at least two coils suitable for measuring a direct current and at least two coils suitable for measuring the alternating current.

15. The sensor according to claim 14, comprising at least four coils suitable for measuring the direct current.

* * * * *